(12) United States Patent
Lee et al.

(10) Patent No.: US 11,394,595 B2
(45) Date of Patent: *Jul. 19, 2022

(54) METHOD FOR MEASURING DISTANCE IN WIRELESS COMMUNICATION SYSTEM AND DEVICE THEREFOR

(71) Applicant: LG ELECTRONICS INC., Seoul (KR)

(72) Inventors: Sangrim Lee, Seoul (KR); Hojae Lee, Seoul (KR); Hanbyul Seo, Seoul (KR); Sukhyon Yoon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 351 days.

This patent is subject to a terminal disclaimer.

(21) Appl. No.: 16/500,709

(22) PCT Filed: Apr. 3, 2018

(86) PCT No.: PCT/KR2018/003928
§ 371 (c)(1),
(2) Date: Oct. 3, 2019

(87) PCT Pub. No.: WO2018/186663
PCT Pub. Date: Oct. 11, 2018

(65) Prior Publication Data
US 2020/0099561 A1    Mar. 26, 2020

Related U.S. Application Data

(60) Provisional application No. 62/535,235, filed on Jul. 21, 2017, provisional application No. 62/481,596, filed on Apr. 4, 2017.

(51) Int. Cl.
*H04B 17/00* (2015.01)
*H04L 27/26* (2006.01)
(Continued)

(52) U.S. Cl.
CPC .......... *H04L 27/265* (2013.01); *G01S 5/0036* (2013.01); *G01S 11/02* (2013.01);
(Continued)

(58) Field of Classification Search
CPC ..... H04L 27/265; H04L 5/007; H04L 5/0048; H04L 5/053; G01S 5/0036; G01S 11/02;
(Continued)

(56) References Cited

U.S. PATENT DOCUMENTS 8,849,926 B2 * 9/2014 Marzencki ............ H04W 84/18
709/224
8,996,031 B2 * 3/2015 Austin ................... G01S 5/0242
455/456.1
(Continued)

FOREIGN PATENT DOCUMENTS

WO    2014043237    3/2014

OTHER PUBLICATIONS

PCT International Application No. PCT/KR2018/003928, Written Opinion of the International Searching Authority dated Jul. 16, 2018, 29 pages.

*Primary Examiner* — Stephen M D Agosta
(74) *Attorney, Agent, or Firm* — Lee Hong Degerman Kang Waimey

(57) ABSTRACT

According to one embodiment of the present invention, a method by which a first wireless device receives a reference signal for distance measurement in a wireless communication system can comprise the steps of: receiving, from a second wireless device, a first reference signal including a first sinusoidal signal having a first angular frequency and a second sinusoidal signal having a second angular frequency; performing fast Fourier transform (FFT) on the first reference signal; acquiring a phase difference between the first sinusoidal signal and the second sinusoidal signal on the (Continued)

basis of the FFT result; and transmitting, to the second wireless device, a second reference signal for the distance measurement and a third reference signal indicating information on the phase difference. The first wireless device is capable of communicating with at least one of another wireless device, a wireless device related to an autonomous driving vehicle, a base station or a network.

14 Claims, 10 Drawing Sheets

(51) Int. Cl.
| | |
|---|---|
| *G01S 11/02* | (2010.01) |
| *H03D 3/02* | (2006.01) |
| *H04L 5/00* | (2006.01) |
| *G01S 13/32* | (2006.01) |
| *G01S 11/04* | (2006.01) |
| *G01S 19/00* | (2010.01) |
| *G01S 5/00* | (2006.01) |
| *G01S 13/84* | (2006.01) |

(52) U.S. Cl.
CPC ............... *G01S 11/04* (2013.01); *G01S 13/32* (2013.01); *G01S 13/84* (2013.01); *G01S 19/00* (2013.01); *H03D 3/02* (2013.01); *H04L 5/0007* (2013.01); *H04L 5/0048* (2013.01); *H04L 5/0053* (2013.01)

(58) Field of Classification Search
CPC .......... G01S 11/04; G01S 13/32; G01S 13/84; G01S 19/00; H03D 3/02
See application file for complete search history.

(56) References Cited

U.S. PATENT DOCUMENTS

| | | | |
|---|---|---|---|
| 9,008,684 B2* | 4/2015 | Tipton | H04W 64/00 |
| | | | 455/410 |
| 9,026,133 B2* | 5/2015 | Fix | H04W 56/0015 |
| | | | 455/433 |
| 9,066,202 B2* | 6/2015 | Dua | H04W 4/02 |
| 9,075,125 B2* | 7/2015 | Aldana | H04W 64/00 |
| 9,319,840 B2* | 4/2016 | Porzio Giusto | H04W 4/023 |
| 9,551,786 B2* | 1/2017 | Seller | G01S 7/003 |
| 9,651,655 B2* | 5/2017 | Feldman | G01S 13/878 |
| 9,684,059 B2* | 6/2017 | Sung | G01S 5/06 |
| 10,314,000 B2* | 6/2019 | Huang | H04L 5/0048 |
| 10,371,789 B2* | 8/2019 | Takizawa | G01S 5/0252 |
| 10,469,184 B1* | 11/2019 | Yu | H04J 3/0682 |
| 11,243,291 B2* | 2/2022 | Chae | G01S 5/10 |
| 2004/0145512 A1* | 7/2004 | Takano | G01S 13/931 |
| | | | 342/107 |
| 2005/0083227 A1* | 4/2005 | Takano | G01S 13/931 |
| | | | 342/75 |
| 2012/0032855 A1 | 2/2012 | Reede et al. | |
| 2012/0122485 A1* | 5/2012 | Bartlett | G01S 5/0284 |
| | | | 455/456.1 |
| 2015/0219749 A1 | 8/2015 | Dua et al. | |
| 2016/0381504 A1 | 12/2016 | Sommer | |

* cited by examiner

METHOD FOR MEASURING DISTANCE IN WIRELESS COMMUNICATION SYSTEM AND DEVICE THEREFOR

CROSS-REFERENCE TO RELATED APPLICATIONS

This application is the National Stage filing under 35 U.S.C. 371 of International Application No. PCT/KR2018/003928, filed on Apr. 3, 2018, which claims the benefit of U.S. Provisional Application No. 62/481,596, filed on Apr. 4, 2017, and 62/535,235, filed on Jul. 21, 2017, the contents of which are all hereby incorporated by reference herein in their entirety.

TECHNICAL FIELD

The present disclosure relates to distance measurement in a wireless communication system, and more particularly, to a method and apparatus for measuring a distance by transmitting and receiving a reference signal (RS).

BACKGROUND ART

First, the existing $3^{rd}$ generation partnership project long term evolution (3GPP LTE)/long term evolution-advanced (LTE-A) system will be briefly described. Referring to FIG. 1, a user equipment (UE) performs an initial cell search (S101). In the initial cell search process, the UE receives a primary synchronization channel (P-SCH) and a secondary synchronization channel (S-SCH) from a base station (BS), performs downlink synchronization with the BS, and acquires information such as a cell identifier (ID). Thereafter, the UE acquires system information (e.g., master information block (MIB)) through a physical broadcast channel (PBCH). The UE can receive the downlink (DL) reference signal (RS) and check the downlink channel status.

After the initial cell search, the UE can acquire more detailed system information (e.g., system information blocks (SIBs)) by receiving a Physical Downlink Control Channel (PDCCH) and a physical downlink control channel (PDSCH) scheduled by the PDCCH (S102).

The UE may perform a random access procedure for uplink synchronization. The UE transmits a preamble (e.g., Msg1) through a physical random access channel (PRACH) (S103), and receives a response message (e.g., Msg2) for the preamble through PDCCH and PDSCH corresponding to the PDCCH. In the case of a contention-based random access, a contention resolution procedure such as additional PRACH transmission (S105) and PDCCH/PDSCH reception (S106) may be performed.

Then, the UE can perform PDCC/PDSCH reception (S107) and physical uplink shared channel (PUSCH)/physical uplink control channel (PUCCH) transmission (S108) as a general uplink/downlink signal transmission procedure. The UE can transmit uplink control information (UCI) to the BS. The UCI may include hybrid automatic repeat request acknowledgment/negative acknowledgment (HARQ ACK/NACK), scheduling request (SR), channel quality indicator (CQI), preceding matrix indicator (PMI) and/or rank indicator (RI), etc.

DISCLOSURE

Technical Problem

An aspect of the present disclosure devised to solve the conventional problem is to provide a method and apparatus for accurately and efficiently measuring the distance between a plurality of wireless devices based on the phase difference between reference signals (RSs) transmitted and received between the plurality of wireless devices.

It will be appreciated by persons skilled in the art that the objects that could be achieved with the present disclosure are not limited to what has been particularly described hereinabove and the above and other objects that the present disclosure could achieve will be more clearly understood from the following detailed description.

Technical Solution

In an aspect of the present disclosure, a method of receiving a reference signal for distance measurement by a first wireless device in a wireless communication system includes receiving, from a second wireless device, a first reference signal including a first sinusoidal signal of a first angular frequency and a second sinusoidal signal of a second angular frequency, performing fast Fourier transform (FFT) on the first reference signal, obtaining a phase difference between the first sinusoidal signal and the second sinusoidal signal based on a result of the FFT, and transmitting a second reference signal for distance measurement and a third reference signal indicating information about the phase difference to the second wireless device.

In another aspect of the present disclosure, a first wireless device for receiving a reference signal for distance measurement in a wireless communication system includes a transceiver, and a processor configured to, by controlling the transceiver, receive, from a second wireless device, a first reference signal including a first sinusoidal signal of a first angular frequency and a second sinusoidal signal of a second angular frequency, perform fast Fourier transform (FFT) on the first reference signal, obtain a phase difference between the first sinusoidal signal and the second sinusoidal signal based on a result of the FFT, and transmit a second reference signal for distance measurement and a third reference signal indicating information about the phase difference to the second wireless device.

In another aspect of the present disclosure, a method of transmitting a reference signal for distance measurement to a first wireless device by a second wireless device in a wireless communication system includes transmitting, to the first wireless device, a first reference signal including a first sinusoidal signal of a first angular frequency and a second sinusoidal signal of a second angular frequency, receiving, from the first wireless device, a second reference signal for distance measurement and a third reference signal indicating phase difference information, and estimating a distance between the first wireless device and the second wireless device by using the phase difference information. The phase difference information indicates a phase difference between the first sinusoidal signal and the second sinusoidal signal, measured by the first wireless device receiving the first reference signal.

In another aspect of the present disclosure, a second wireless device for transmitting a reference signal for distance measurement to a first wireless device in a wireless communication system includes a transceiver, and a processor configured to, by controlling the transceiver, transmit, to the first wireless device, a first reference signal including a first sinusoidal signal of a first angular frequency and a second sinusoidal signal of a second angular frequency, receive, from the first wireless device, a second reference signal for distance measurement and a third reference signal indicating phase difference information, and estimate a distance between the first wireless device and the second wireless device by using the phase difference information. The phase difference information indicates a phase difference between the first sinusoidal signal and the second sinusoidal signal, measured by the first wireless device receiving the first reference signal.

A phase of the third reference signal may have as large an offset as the phase difference from a phase of the second reference signal.

The phase difference may be calculated by Equation A.

$$\frac{X_{RX}(w_2)}{X_{RX}(w_1)} = \exp(j*(w_2 - w_1)(t_{s,RX} - t_{a,RX}))$$ [Equation A]

In Equation A, '$t_{s,RX}$' may represent a starting time of the FFT for the first reference signal, '$t_{a,RX}$' may represent an arrival time of the first reference signal at the first wireless device, '$w_1$' may represent the first angular frequency, '$w_2$' represents the second angular frequency, '$X_{RX}(w_1)$' may represent an FFT result of the first sinusoidal signal, and '$X_{RX}(w_2)$' may represent an FFT result of the second sinusoidal signal.

A distance between the first wireless device and the second wireless device may be calculated by Equation B.

$$d = \frac{c}{2}\left(t_{symb} - \frac{\theta}{2\pi * \Delta f} - delta_2\right)$$ [Equation B]

where 'd' may represent the distance between the first wireless device and the second wireless device, 'c' may represent the speed of light, '$t_{symb}$' may represent one symbol length, 'θ' represents the phase difference, Δf may represent a subcarrier spacing between the second reference signal and the third reference signal, and '$delta_2$' may represent a difference between an arrival time of the second reference signal at the second wireless device and a time of performing FFT on the second reference signal.

'$delta_2$' may be calculated by Equation C.

$$delta_2 = t_{s,Tx} + (n+1) * t\_symb - t_{a,Tx}$$ [Equation C]

In [Equation C], '$t_{s,Tx}$' may represent a time when the first reference signal is transmitted from the second wireless device, '$t_{a,Tx}$' may represent the arrival time of the second reference signal at the second wireless device, and 'n' may represent the number of symbols between the first reference signal and the second reference signal.

A process of exchanging the first reference signal, the second reference signal, and the third reference signal may be performed alternately in a plurality of wireless devices including the first wireless device, the second wireless device, and the third wireless device.

The first wireless device may estimate a distance between the second wireless device and the third wireless device by overhearing information about a phase difference transmitted to the second wireless device by the third wireless device.

Advantageous Effects

According to an embodiment of the present disclosure, because a reception device, which has measured a phase difference using a first reference signal for distance measurement, transmits a third reference signal indicating the measured phase difference along with a second reference signal for distance measurement to a transmission device, even though the transmission device and the reception device are asynchronous with each other, the distance between the transmission device and the reception device may be measured based on the phase difference, and an error range of distance measurement may further be reduced due to the use of the phase difference, instead of a time difference between reference signals.

It will be appreciated by persons skilled in the art that the effects that can be achieved with the present disclosure are not limited to what has been particularly described hereinabove and other advantages of the present disclosure will be more clearly understood from the following detailed description taken in conjunction with the accompanying drawings.

BEST MODE FOR CARRYING OUT THE INVENTION

Figure 1:
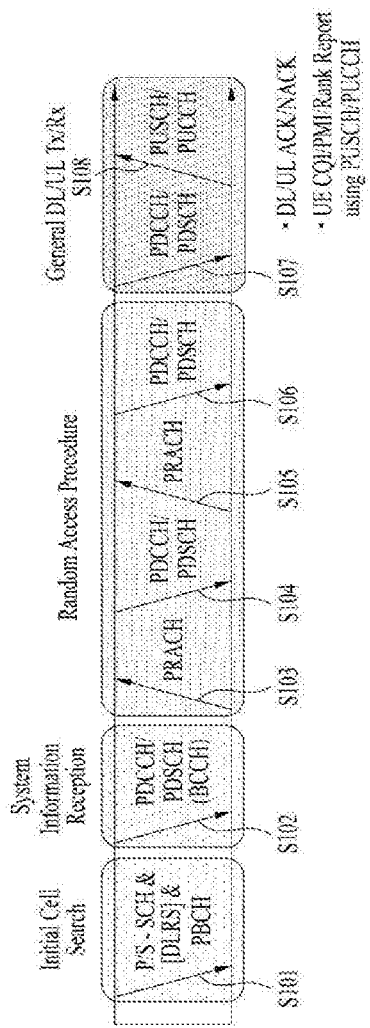
FIG. 1 illustrates physical channels used in a $3^{rd}$ generation partnership project (3GPP LTE)/long term evolution-advanced (LTE-A) system and a general signal transmission method using the physical channels.

The following description of embodiments of the present disclosure may apply to various wireless access systems including CDMA (code division multiple access), FDMA (frequency division multiple access), TDMA (time division multiple access), OFDMA (orthogonal frequency division multiple access), SC-FDMA (single carrier frequency division multiple access) and the like. CDMA can be implemented with such a radio technology as UTRA (universal terrestrial radio access), CDMA 2000 and the like. TDMA can be implemented with such a radio technology as global system for mobile communications/general packet radio service/enhanced data rates for GSM evolution (GSM/GPRS/EDGE). OFDMA can be implemented with such a radio technology as IEEE 802.11 (Wi-Fi), IEEE 802.16

(WiMAX), IEEE 802.20, E-UTRA (Evolved UTRA), etc. UTRA is a part of universal mobile telecommunications system (UMTS). 3$^{rd}$ generation partnership project long term evolution (3GPP LTE) is a part of evolved UMTS (E-UMTS) that uses E-UTRA. 3GPP LTE adopts OFDMA in downlink and adopts SC-FDMA in uplink. LTE-advanced (LTE-A) is an evolved version of 3GPP LTE.

For clarity, the following description mainly concerns 3GPP LTE system or 3GPP LTE-A system, by which the technical idea of the present disclosure may be non-limited. Specific terminologies used in the following description are provided to help understand the present disclosure and the use of the terminologies can be modified to a different form within a scope of the technical idea of the present disclosure.

As many as possible communication devices have demanded as high as communication capacity and, thus, there has been a need for enhanced mobile broadband (eMBB) communication compared with legacy radio access technology (RAT) in a recently discussed next-generation communication system. In addition, massive machine type communications (mMTC) for connecting a plurality of devices and objects to provide various services anytime and anywhere is also one of factors to be considered in next-generation communication. In addition, in consideration of a service/user equipment (UE) that is sensitive to reliability and latency, ultra-reliable and low latency communication (URLLC) has been discussed for a next-generation communication system.

As such, new RAT that considers eMBB, mMTC, URLCC, and so on has been discussed for next-generation wireless communication.

Position measurement in a legacy LTE system will first be described briefly.

Position Measurement in LTE Systems

In the LTE system, a location position protocol (LPP) has been introduced. In an LPP model, a location server may transmit assistance data for positioning to a UE. That is, the location server may transmit the assistance data to the UE to enable the UE to use observed time difference of arrival (OTDOA)/assisted global navigation satellite system (A-GNSS). In the LPP model, the UE uses a reference signal (RS) (e.g., positioning RS) for positioning and transmits measurement information or location information from the RS to the location server (e.g., Evolved Serving Mobile Location Center (E-SMLC)/UPL location platform (SLP)), and the location server is responsible for making a final decision on a location. Location information and a method of transmitting and receiving the location information are standardized into the LPP standard, and the LPP standard may include an information element (IE) and a signaling procedure for location information.

The LPP technology largely includes three functions: one of them is A-GNSS, another function is OTDOA, and the other is enhanced cell ID (E-CID).

A-GNSS is a satellite-based positioning scheme, which offers the benefit of shortening an initial positioning time because basic satellite information for positioning is received through a wireless network (e.g., LTE). In the A-GNSS scheme, accurate location information is obtained through communication between a global positioning system (GPS) and a location server of the network.

In OTDOA, a measurement value called a reference signal time difference (RSTD) is used to calculate a propagation time difference between a reference evolved Node B (eNB) and a neighboring eNB. That is, a signal in a specific frame is received from the neighboring eNB, a tap closest in time to a tap received from the neighboring eNB is selected from among delay taps received in the frame from the reference eNB, and the time difference between the taps is calculated as an RSTD value. Therefore, performance may depend on how effective taps are estimated. As such, OTDOA is a scheme in which a UE obtains a distance and a location based on the difference between arrival times of multiple eNB (or cell) signals.

E-CID is a scheme of narrowing the location of a UE by combining a legacy CID scheme and a received signal strength indication (RSSI) scheme into a hybrid scheme. A received signal received power (RSRP) and a received signal received quality (RSRQ) are provided as related measurement values. In the E-CID scheme, the UE estimates a location through round trip measurement, pathloss related measurement, and angle of arrival measurement based on analysis of the RSRP of an LTE OFDMA signal.

[Ranging Estimation Based on Phase & Phase Compensation]

A description will be given of a method of measuring a distance by using the phase of a signal transmitted and received between different wireless devices (e.g., a transmission device and a reception device). In the following description, a wireless device that first transmits a signal is referred to as a transmission device, and a device that first receives a signal is referred to as a reception device. However, the transmission device may also receive a signal later, and the reception device may also transmit a signal. That is, the transmission device may also include a transmitter and a receiver, and the reception device may also include a transmitter and a receiver. For example, the transmission device and the reception device may be an eNB and a UE, respectively. In another example, the transmission device and the reception device may be a plurality of eNBs or a plurality of UEs.

A process of estimating the distance between the transmission device and the reception device may be referred to as ranging. Since a ranging procedure described herein is for distance estimation, those skilled in the art will understand that the ranging procedure is completely different from a ranging procedure performed for random access or synchronization in an IEEE-based wireless communication system such as WiMAX, in spite of the same appellation.

First, a phase difference-based quantization method and phase difference compensation method available for phase information-based ranging estimation will be described below.

Because RSTD is used in the legacy LTE system, the accuracy of distance measurement is limited according to the unit of one symbol length, and there is a constraint that the transmission device and the reception device should operate in synchronization. For example, according to the RSTD scheme, the reception device should obtain time correlations with an RS and detect a time at which a peak appears, while moving a window corresponding to N fast Fourier transform (FFT) samples.

On the other hand, according to the phase difference-based ranging estimation schemed, the accuracy of distance measurement is not limited according to the unit of one symbol length, and the transmission device and the reception device may operate asynchronously.

While the following examples are based on the assumption of transmission and reception of signals in two angular frequencies, which should not be construed as limiting the present disclosure, the present disclosure may be applied to more angular frequencies. It is also assumed in the examples that a plurality of angular frequency components are transmitted simultaneously, for the convenience of description.

However, it is also possible to implement the present disclosure by transmitting the frequencies at predetermined different time points and considering the transmission time difference.

Further, it is assumed that a time point at which the transmission device/the reception device performs a signal transmission/reception operation is quantized. For example, when the transmission device/the reception device transmits/receives an OFDM signal, a boundary point of each OFDM symbol is a quantized time point for performing a transmission/reception operation. It is assumed that the starting time points of the transmission and reception operations of the transmission device and the reception device are $t_{s,TX}$ and $t_{s,RX}$, respectively, and are repeated every $t_{symb}$, $t_{symb}$ may be the length of an OFDM symbol.

Figure 2:
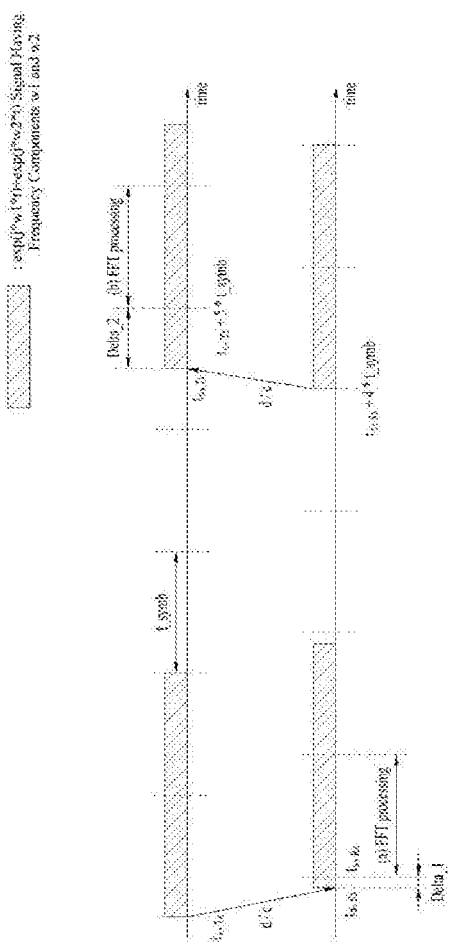
FIG. 2 illustrates a series of processes for measuring the distance between a transmission device and a reception device according to an embodiment of the present disclosure.

FIG. 2 is a flowchart illustrating a series of processes for measuring the distance between a transmission device and a reception device according to an embodiment of the present disclosure. While it is assumed that the reception device has been synchronized with a synchronization signal transmitted by the transmission device, for the convenience of description, distance measurement based on a phase difference may also be applied even when the transmission device and the reception device are asynchronous with each other.

Although for the convenience of description, a signal repeatedly transmitted during two symbols is considered, a signal transmission having a cyclic prefix (CP) and data for one symbol length may also be considered.

First, the transmission device transmits a sinusoidal signal having angular frequencies $w_1$ and $w_2$ as an RS (e.g., ranging RS) for distance measurement at a time $t_{s,Tx}$. For example, an RS for distance measurement at a specific time t may be defined by $RS(t)=e^{j*w1*t}+e^{j*w2*t}$. For convenience, a signal transmitted by the transmission device is referred to as a first signal.

The transmitted first signal is delayed by d/c based on the distance d between the transmission device and the reception device and the speed c of light and arrives at the reception device at a time $t_{a,Rx}$.

Due to sampling (or quantization), the reception device actually starts to acquire a baseband signal (e.g., sampled values) at the time $t_{a,Rx}$. If the size of fast Fourier transform (FFT) performed by the reception device is N, the reception device may obtain values corresponding to $w_1$ and $w_2$ by subjecting a total of N sampled values to FFT.

The phase difference between a $w_1$ component, $X_{RX}(w_1)$ and a $w_2$ component, $X_{RX}(w_2)$ of the FFT sampled values may be obtained by Equation 1.

$$\frac{X_{RX}(w_2)}{X_{RX}(w_1)} = \exp(j*(w_2-w_1)(t_{s,RX}-t_{a,RX})) \quad \text{[Equation 1]}$$

In Equation 1, the phase difference is $(w_2-w_1)(t_{s,RX}-t_{a,RX})$. $X_{RX}(w_1)/X_{RX}(w_2)$ is a value that may be calculated from the first signal received by the reception device, and $(w_2-w_1)$ is a predefined value already known to the reception device. Therefore, the reception device may obtain Delta_1=$t_{s,RX}-t_{a,RX}$ by Equation 1. Delta_1 represents the difference between the starting time of OFM processing at the reception device and an actual arrival time of the first signal at the reception device.

Like the transmission device, the reception device transmits a sinusoidal signal (referred to as a second signal) having the angular frequencies $w_1$ and $w_2$ after n symbols. In FIG. 2, it is assumed that n=4.

Upon receipt of the second signal, the transmission device may acquire Delta_2=$t_{s,Tx}$+(n+1)*t_symb-$t_{a,Tx}$, by FFT-processing N sampled values acquired starting from a time '$t_{s,Tx}$+(n+1)*t_symb'.

Therefore, the round trip time (RTT) of a signal is defined by Equation 2.

$$2*d/c=t\_symb-Delta\_2-Delta\_1 \quad \text{[Equation 2]}$$

As described, c is a fixed constant (i.e., the speed of light). Although the transmission device knows the values of Delta_2 and t_symb, the transmission device does not know the value of Delta_1. Therefore, to measure the distance d between the transmission device and the reception device, the transmission device should acquire information about Delta_1 measured by the reception device.

Example 1-1. Method of Quantizing and Transmitting Delta 1

For example, the reception device may quantize Delta_1 to transmit the value of Delta_1 to the transmission device. The quantized Delta_1 value may be transmitted by physical-layer signaling or higher-layer signaling such as radio resource control (RRC) signaling.

As noted from Equation 1, when a phase difference exceeds $2\pi$, ambiguity occurs. For example, the reception device may not distinguish a phase difference of $2\pi+\alpha$ from a phase difference of $\alpha$.

It is assumed that the quantization level is $2^Q$ (i.e., Q-bit quantization) and a Q value is known to the transmission device and the reception device. Since the Q value corresponds to a payload size, the Q value is preferably constant regardless of the values of w1 and w2.

Therefore, since the range of ambiguity varies depending on the value of w2−w1, a related quantization technique and interpretation are required.

The maximum value of Delta_1 is $2\pi/(w2-w1)$ within an ambiguity-free range. When the quantization level is $2^Q$, a least significant bit (LSB) (1 bit), that is, a minimum unit of quantization is $2\pi/(w2-w1)/2^Q$.

For example, when w2−w1=$2\pi*15$ kHz, the maximum value of Delta_1 is 66.67 us. If Q is assumed to be 10, the minimum quantization unit is 66.67 us/1024. Therefore, when the reception device transmits a binary value, 00 0000 1111 (=15) in payload, the transmission device may calculate Delta_1 as 66.67 us/1024*15.

In another example, when w2−w1=$2\pi*60$ kHz, the maximum value of Delta_1 is 16.67 us. If the quantization level Q=8 and a payload value received by the transmission device is 9, Delta_1=16.67 us/256*9.

Example 1-2. Method of Quantizing and Transmitting Phase Difference of Equation 1

In another example, the reception device may quantize and transmit the phase difference of Equation 1. The phase difference may have a value between 0 and $2\pi$.

For example, if Q is assumed to be 10, the minimum unit of quantization is $2\pi/1024$. If w2−w1=15 kHz*$2\pi$ and the reception device transmits 00 0000 1111 (=15) in payload, the transmission device may acquire a phase difference of $2\pi/1024*15$. The transmission device may obtain Delta_1 by calculating $2\pi/1024*15/(15 k*2\pi)$=66.67 us/1024*15.

While the above examples have been described in the context of an angular frequency, (angular frequency)/$2\pi$ will be referred to as a frequency hereinbelow, for the convenience of description.

In a new RAT (NR) system discussed in the 3GPP, even one eNB may configure a different subcarrier spacing (SCS) according to a service (e.g., eMBB, URLLC, mMTC). For example, the frequency spacing between two subcarriers may be set to 15 kHz for eMBB, 60 kHz for URLLC, and 2.5 kHz for mMTC.

In the NR system, the transmission device and the reception device may operate in the afore-described quantization method. For example, if Q=10 regardless of a service, an eMBB UE may interpret an RS for distance measurement based on a 15-kHz SCS, and an mMTC interpret an RS for distance measurement based on a 2.5-kHz SCS. The resulting quantized Delta_1 or phase difference value may be transmitted to the network. As such, a different SCS may be configured for the RS for distance measurement, for each service. Further, a different SCS may be configured for the RS in consideration of requirements according to a UE class.

Both Delta_1 and Delta_2 described above are values for distance measurement. However, Delta_2 constitutes a phase difference of the RS which is changed depending on a measured distance. On the other hand, Delta_1 is a value independent of the distance between the transmission device and the reception device, and represents the difference between an FFT processing time and a time when the first signal actually arrives at the reception device.

Therefore, although the value of Delta_1 affects the distance measurement, Delta_1 may be processed separately from the RS phase difference for Delta_2 measurement. For example, Delta_1 may be obtained from a first RS having a phase difference of 60 kHz, and Delta_2 may be obtained from a second RS having a phase difference of 15 kHz, for coverage extension. For example, although an RS having a large w2−w1 value may be more robust against noise/interference, an ambiguity-free distance between the transmission device and the reception device is reduced. On the other hand, if the value of w2−w1 is small, the ambiguity-free distance between the transmission device and the reception device increases, so that the RS may be suitable for use in wider coverage.

Therefore, the network may preferably set a phase difference which is a closest value larger than the reciprocal of the maximum value of Delta_1.

In Example 1-1/1-2, the method of quantizing and transmitting Delta_1 or a phase difference value in a reception device has been described. However, a large number of payload bits may be required to reduce a distance measurement error caused by a quantization error. That is, if the minimum quantization unit is set to be small in order to improve the resolution of the distance measurement, the payload size increases.

To overcome this disadvantage, a method of directly indicating a phase difference without quantization may be considered in another example of the present disclosure.

Example 2. Method of Transmitting Reference Signal Indicating Phase Different Information According to an embodiment of the present disclosure, the reception device may transmit an RS (e.g., a third signal) indicating phase difference information. In this case, the transmission device is advantageous in that Delta_1 may be obtained as a continuous value rather than a quantized value.

Figure 3:
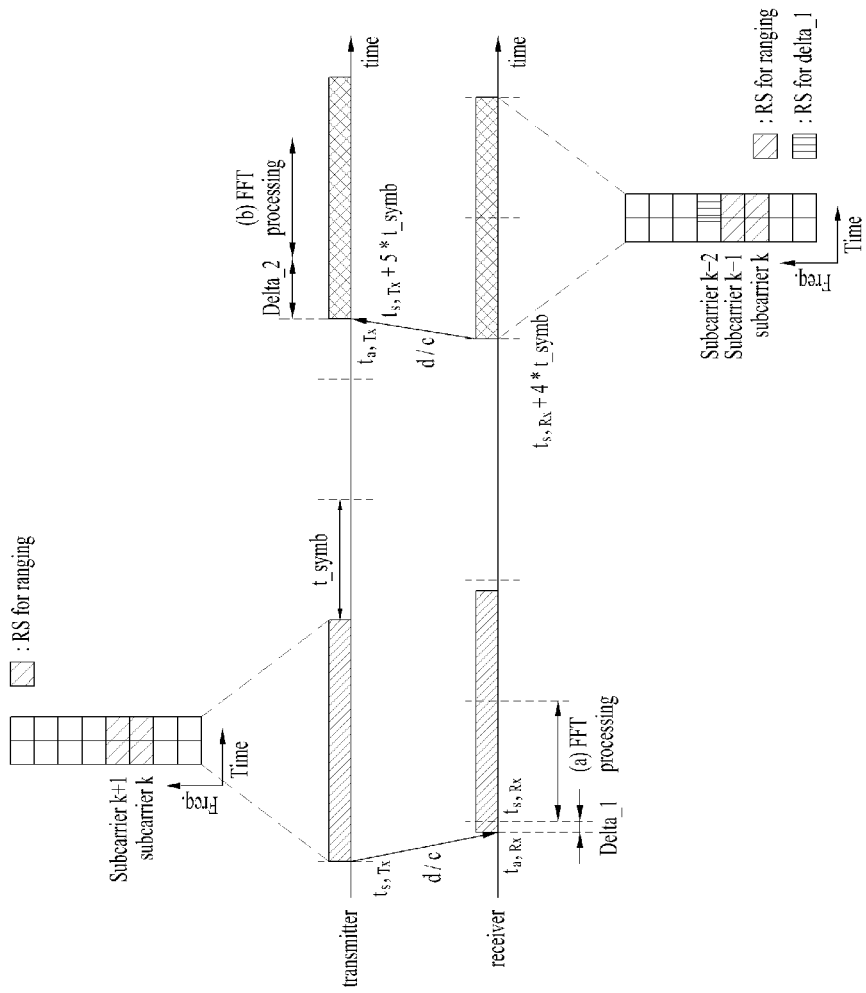
FIG. 3 illustrates transmission of a reference signal (RS) for correcting Delta_1 from a reception device according to an embodiment of the present disclosure.

FIG. 3 illustrates transmission of an RS for Delta_1 correction from a reception device according to an embodiment of the present disclosure.

In the illustrated case of FIG. 3, unlike the example described in FIG. 2, the reception device transmits an additional RS (e.g., third signal) that carries phase information corresponding to Delta_1. In FIG. 3, an RS (e.g., third signal) transmitted on subcarrier k+2 may be set such that a phase difference from an RS (e.g., second signal) transmitted on subcarrier k+1 has a phase difference value of Equation 1.

The process of generating and transmitting a third signal having a phase value corresponding to Delta_1 by the reception device will be described in more detail. First, it is assumed that the reception device has obtained a phase value θ expressed as Equation 3 by Equation 1.

$$\theta = 2\pi*(f_2-f_1)(t_{s,RX}-t_{a,RX})$$ [Equation 3]

In Equation 3, $f_1=w_1/2\pi$ and $f_2=w_2/2\pi$.

The reception device transmits a sinusoidal signal (e.g., second signal) for distance measurement on subcarriers k and k+1. In this case, it is assumed that the phase of the RS is zero. Therefore, the value transmitted in resource elements (REs) of subcarriers k and k+1 is equal to one.

In addition, the reception device transmits a value (e.g., third signal) of exp(j*θ) an the RE corresponding to subcarrier k+2.

The transmission device may perform FFT from a time $t_{s,Tx}+(n+1)*t\_symb$ (e.g., n=4 in FIG. 3) to measure the phase difference between subcarriers k and k+1 and thus obtain Delta_2. For example, the transmission device may acquire Delta_2 through the second signal.

Meanwhile, the phase difference φ between subcarriers k+1 and k+2 measured by the transmission device based on the third signal may be expressed as Equation 4.

$$\emptyset = (2\pi*\Delta f*\text{delta}_2)+\theta$$ [Equation 4]

In Equation 4, Δf denotes a frequency spacing between subcarriers k+1 and k+2. Δf may be a predefined value already known to the transmission device.

Therefore, the transmission device may obtain θ by using Delta_2 acquired through the second signal according to Equation 5.

$$\theta = -(2\pi*\Delta f*\text{delta}_2)+\emptyset$$ [Equation 5]

The distance d may finally be calculated by Equation 6.

$$d = \frac{c}{2}\left(t_{symb} - \frac{\theta}{2\pi*\Delta f} - delta_2\right)$$ [Equation 6]

FIG. 3 illustrates that the RS (e.g., third signal) for Delta_1 and the RS (e.g., second signal) for ranging are multiplexed in frequency division multiplexing (FDM) in neighboring subcarriers. This is because arranging the RSs in a bandwidth ensuring channel coherence is favorable in obtaining a more accurate phase difference.

According to another example of the present invention, however, the RS for Delta_1 and the RS for ranging may not be adjacent to each other in the frequency domain, or may be multiplexed in time division multiplexing (TDM) in different time resources. The locations of the RSs may be configured by the network.

The network may measure the location of the reception device based on information about the distance between each transmission device and the reception device, which has been acquired in the above-described manner.

Embodiments to which the above distance measuring methods are applied will be described below.

Example of Distance Measurement Between Multiple Cells and UE

Figure 4:
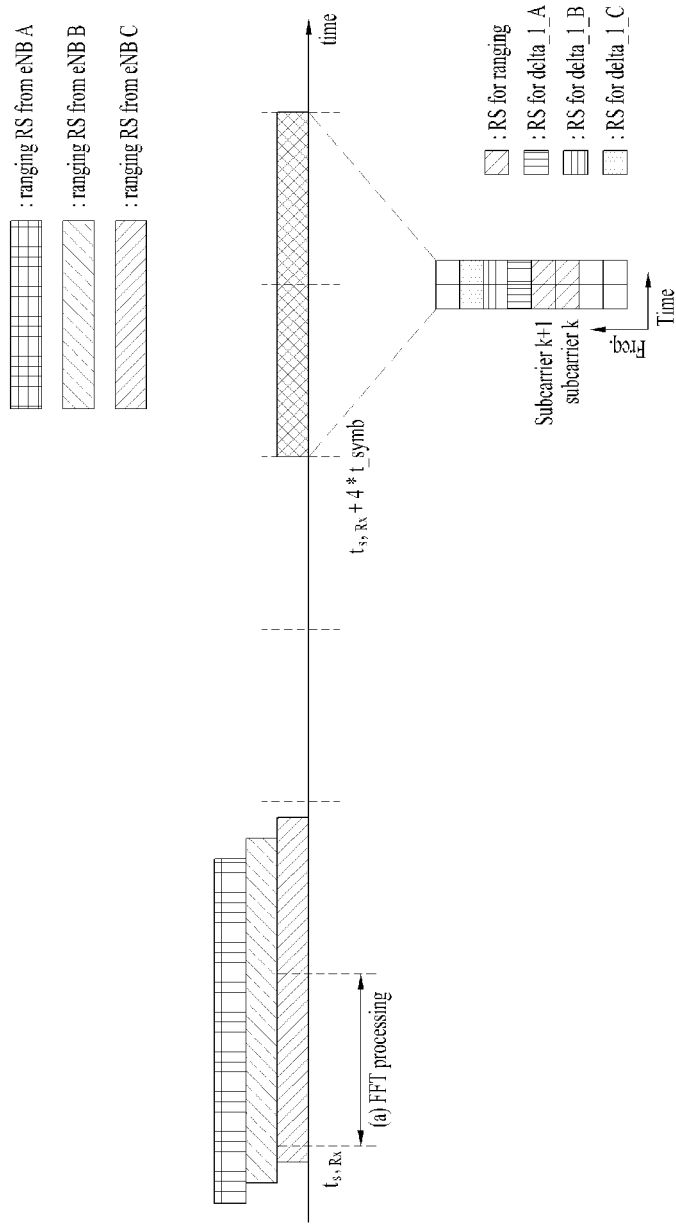
FIG. 4 illustrates measurement of the distances between multiple cells and a UE according to an embodiment of the present disclosure.

FIG. 4 is a diagram illustrating distance measurement between multiple cells and a UE according to an embodiment of the present disclosure. It is assumed that the multiple cells transmit RSs (e.g., first signals) for distance measurement, and the UE measures the RSs and then transmits an RS (e.g., second signal) and phase difference information (e.g., third signal). It is also assumed that each cell belongs to a different eNB.

eNBs A, B, and C may transmit RSs for distance measurement on different subcarriers in the same subframe. A serving eNB may indicate the frequency position of the RS of each eNB to the UE.

After performing FFT on the received RSs, the UE may obtain the difference between the arrival time of the RS (e.g., the first signal) from each of eNBs A, B, and C and the FFT starting time of the RS, for each of eNBs A, B, and C. Based on this, the UE additionally transmits, to eNBs A, B, and C, three RSs (e.g., third signals) to which phase difference values corresponding to Delta_1 of eNBs A, B, and C are additionally applied, together with ranging RSs (e.g., second signals).

Each eNB performs FFT according to its symbol boundary, and then detects phase information (e.g., third signal) of Delta_1 corresponding to the eNB to measure the distance from the UE.

The serving eNB may configure the UE with the frequency positions (e.g., subcarriers) of the RSs (e.g., third signals) for the phase information of Delta_1 allocated to eNBs A, B, C.

There is no need for perfect synchronization between eNBs. In addition, each eNB may transmit a ranging RS at a different timing. In this case, the UE may perform FFT on an eNB basis.

The UE may not transmit a ranging RS and an RS for Delta_1 in the same subframe to an eNB.

According to the example of FIG. 4, since the third signals are transmitted in narrow bands, radio resources may be used more efficiently.

Figure 5:
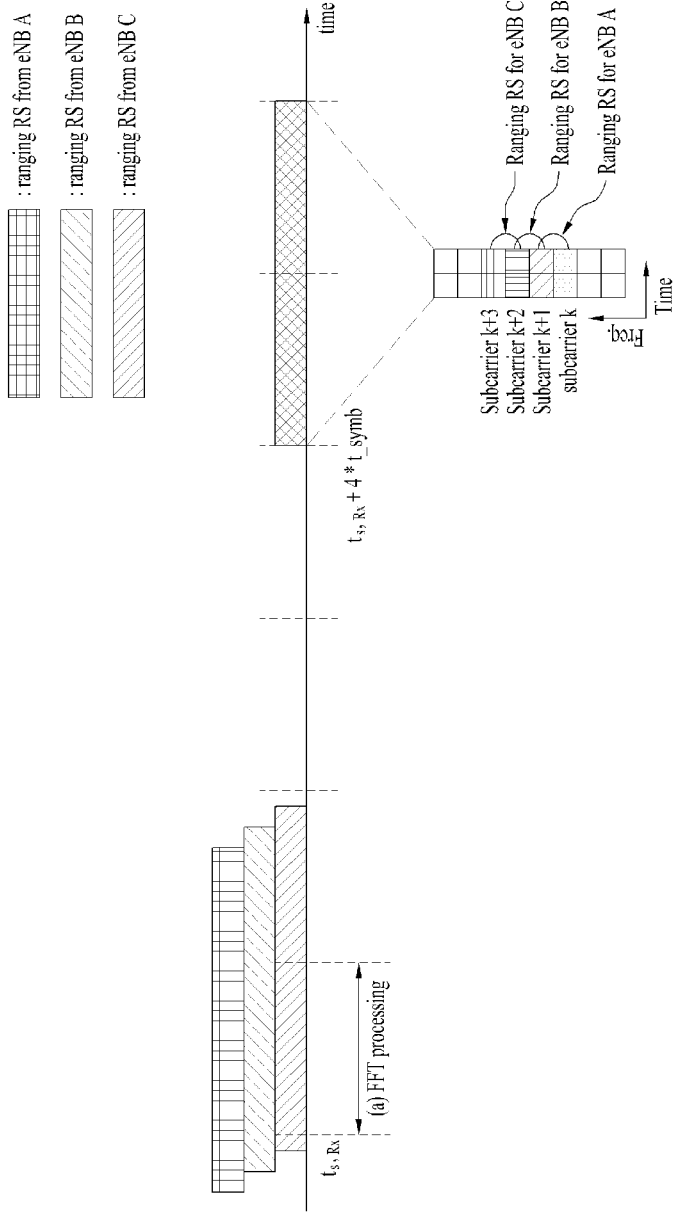
FIG. 5 illustrates measurement of the distances between multiple cells and a UE according to another embodiment of the present disclosure.

FIG. 5 is a diagram illustrating distance measurement between multiple cells and a UE according to another embodiment of the present disclosure.

The UE may transmit phase difference information of Delta_1 for eNBs A, B, and C in the manner illustrated in FIG. 5. For example, the UE sets the phase difference between a signal of subcarrier k and a signal of subcarrier k+1 to a phase difference corresponding to Delta_1 of eNB A. The UE then sets the phase difference between the signal of subcarrier k+1 and a signal of subcarrier k+2 to a phase difference corresponding to Delta_1 of eNB B. Finally, the UE sets the phase difference between the signal of subcarrier k+2 and a signal of subcarrier k+3 to a phase difference corresponding to Delta_1 of eNB C.

Accordingly, each eNB may obtain a phase difference between signals of two subcarriers allocated to the eNB and calculate an RTT and a distance based on the phase difference.

The positions of the two subcarriers assigned to each eNB may be predefined or configured for the terminal by the network. Alternatively, eNBs A, B, and C may also set the positions of the two subcarriers for each eNB through cooperation.

Figure 6:
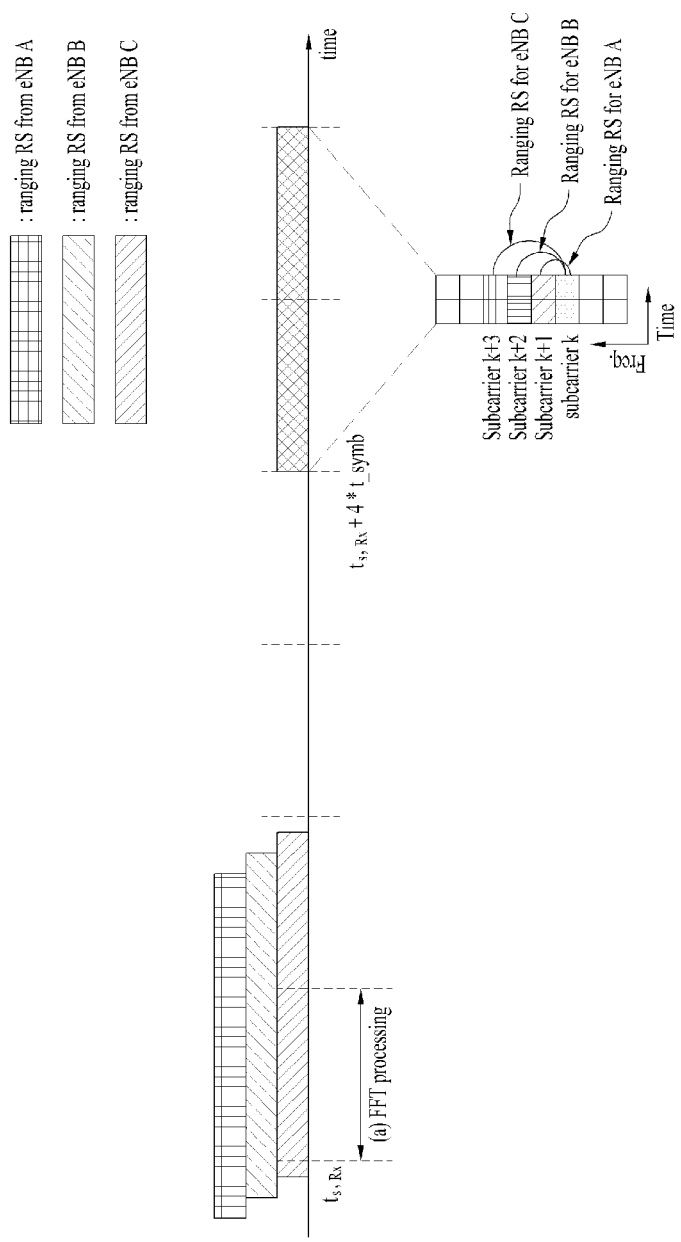
FIG. 6 illustrates measurement of the distances between multiple cells and a UE according to another embodiment of the present disclosure.

FIG. 6 is a diagram illustrating distance measurement between multiple cells and a UE according to another embodiment of the present invention.

According to FIG. 6, a phase difference corresponding to Delta_1 of each eNB is set based on a signal on subcarrier k. Information about Delta_1 of eNB A is set in a signal on subcarrier k+1, information about Delta_1 of eNB B in a signal on subcarrier k+2, and information about Delta_1 of eNB C in a signal on subcarrier k+3.

According to the example of FIG. 6, there is a trade-off in which as the distance resolutions of eNBs B and C are reduced, the robustness of the performance against noise is increased.

An SCS (i.e., frequency spacing) of a ranging RS and a signal carrying the phase difference information of Delta_1 may be configured as a different value according to a maximum distance and a distance resolution.

Example of Distance Measurement Between Multiple UEs

The foregoing distance measuring methods may be applied to distance measurement between multiple UEs such as device to device (D2D) or vehicle to vehicle (V2V) UEs.

For example, it is assumed that there are UEs A, B, and C. UE A broadcasts a ranging RS (e.g., first signal) at a predefined time. UE B and UE C may calculate Delta_1_A from the ranging RS of UE A, respectively.

Subsequently, UE B broadcasts a ranging RS, and UEs A and C may calculate Delta_1_B, respectively. Finally, UE C broadcasts a ranging RS, and UEs A and B calculate Delta_1_C, respectively.

UE A transmits RSs (e.g., third signals) for Delta_1_B and Delta_1_C measured by UE A, together with ranging RSs (e.g., second signals). UE B and UE C also transmit second signals and third signals, similarly to UE A. Therefore, each of UEs A, B, and C may measure the distances between the UE and the other UEs.

Further, under the control of an eNB or when coordination is possible between the UEs, ranging RSs (e.g., first signals) transmitted by UEs A, B, and C may be multiplexed in FDM in the same subframe, and then ranging RSs (e.g., second signals) and RSs (e.g., third signals) for Delta_1 may be simultaneously transmitted in another subframe. In this case, a distance may be measured by the transmissions in the two subframes.

Example of Ranging RS Grouping

In the method of measuring a distance based on a phase difference, if the frequency spacing between RSs is small, a maximum ambiguity-free distance is large. However, performance degradation may occur due to a phase estimation error.

On the contrary, as the frequency spacing increases, robustness against a phase estimation error increases, but the maximum distance decreases. Therefore, the frequency spacing between RSs for ranging needs to be appropriately selected.

When one eNB is to measure the distances of a plurality of UEs, the eNB may set a frequency spacing (e.g., SCS) of a ranging RS transmitted by each UE by grouping the UEs. For example, on the assumption that there are ranging RSs having an SCS of 15 kHz (for group1) and an SCS of 30 kHz (for group 2), the eNB may configure the frequency spacings for the UEs by RRC signaling or physical-layer signaling. Each configured UE may transmit a ranging RS having a corresponding frequency spacing, and resource multiplexing between multiple UEs may be configured by the eNB.

[Relative Map Construction]

Based on the above-described phase difference-based distance measuring method, a method of determining relative positions of other nodes by each node in an environment with a plurality of wireless nodes (e.g., UEs) is proposed.

When it is said that a specific node knows relative positions between nodes, this may mean that the specific node knows not only the distances from the specific node to other nodes but also the distances between the other nodes. Information about a relative position may be referred to as a relative map.

A transmission and reception procedure and a reception algorithm of each node, for determining a relative position will be described below.

Figure 7:
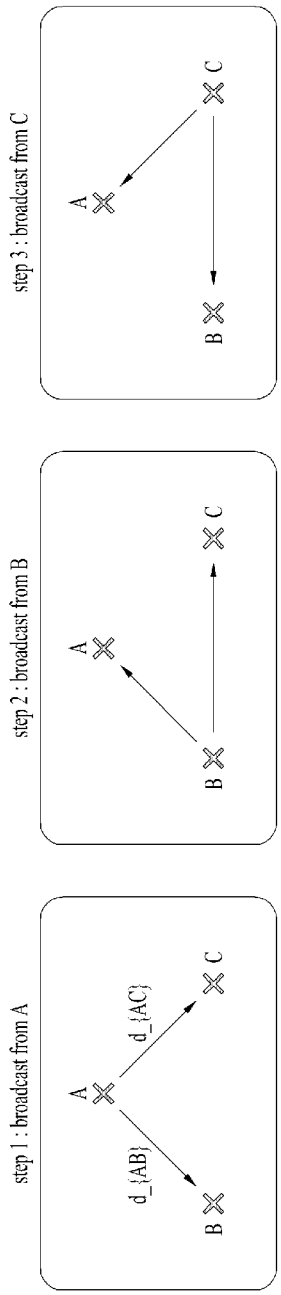
FIG. 7 illustrates a procedure for configuring a relative map for multiple nodes according to an embodiment of the present disclosure.
Figure 8:
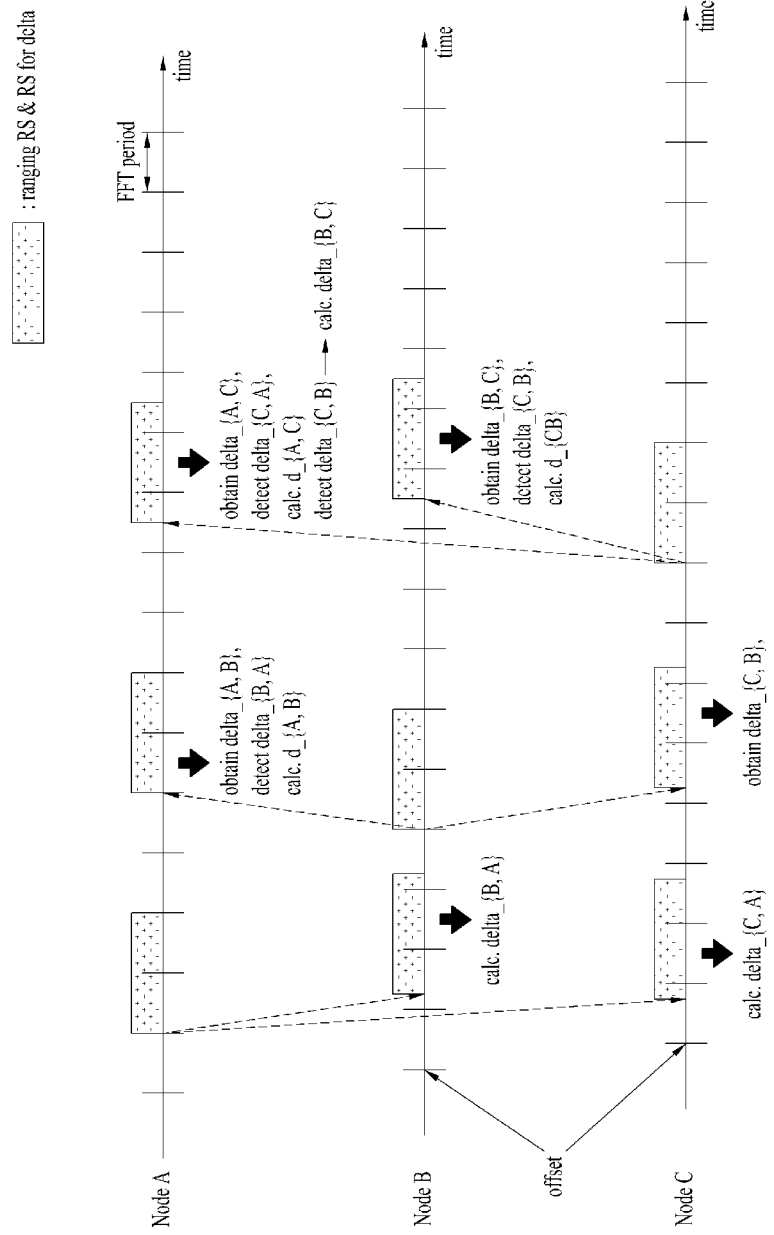
FIG. 8 illustrates signal transmission and reception among nodes A, B, and C illustrated in FIG. 7.

FIG. 7 is a diagram illustrating a procedure of configuring a relative map for a plurality of nodes according to an embodiment of the present disclosure. FIG. 8 illustrates signal transmission and reception among nodes A, B, and C illustrated in FIG. 7.

Although three nodes are illustrated for convenience, the present disclosure may also be applied even when three or more nodes exist. In addition, each node transmits and receives based on its own clock time, and the operation according to the present embodiment may be possible even when the nodes are asynchronous.

In an initial process, the nodes have no knowledge of distance information between each other. It is assumed that the transmission order of a ranging RS and an RS carrying phase difference information is set to Node A, Node B, and Node C, which should not be construed as limiting the present disclosure.

STEP 1: Node A broadcasts ranging RS 1. Upon receipt of the ranging RS from node A, node B and node C obtain phase differences according to their sampling times. The phase differences are defined as Delta_{B, A} and Delta_{C, A}. For example, node B calculates and stores delta_{B, A}, and node C calculates and stores delta_{C, A}.

STEP 2: After configured M symbols or subframes, node B transmits an RS carrying information of Delta_{B, A} acquired in STEP 1, together with ranging RS 2. Node A may calculate and store Delta_{A, B} from ranging RS 2 and find Delta_{B, A} from the RS received together with ranging RS 2. Thus, node A may know a distance d_{A, B} between node A and node B. Upon receipt of the signal from node B, node C calculates Delta_{C, B} from ranging RS 2 and stores Delta_{C, B}.

STEP 3: After the configured N symbols or subframes, node C transmits information of Delta_{C, A} and Delta_{C, B} acquired in STEP 1/2, together with ranging RS 3. Node A may store Delta_{A, C} from ranging RS 3, store Delta_{A, C}, and detect Delta_{C, A} received together with ranging RS 3, thereby determining d_{A, C}. Further, node A may determine d_{B, C} by detecting (e.g., overhearing) Delta_{C, B} which is information transmitted to node B by node C. On the other hand, node B may Delta_{B, C} from ranging RS 3, store Delta_{B, C}, and detect delta_{C, B}, thereby determining d_{B, C}.

In this manner, node A may determine the distance d_{B, C} between node B and node C as well as the distance d_{A, B} between node A and node B and the distance d_{A, C} between node A and node C. For example, node A may configure a relative map, relying on the second cosine law.

Next, an exemplary algorithm by which node A obtains d_{B, C} through overhearing will be described in detail.

For example, in STEP 2 of FIG. 7, node A may calculate d_{A, B} based on Example 2 and Equation 1. Node A may estimate the starting time of a relative FFT window of node B (e.g., an offset from the starting time of an FFT window of node A) from d_{A, B}. The relative starting time of the FFT window of node B may be calculated by Equation 7, for example.

$$\text{Est\_offset\_fft\_Node}B(\text{in radian}) = \text{delta}\_\{B,A\} + (d\_\{A,B\}/c)*2*\pi*\Delta f \quad \text{[Equation 7]}$$

In Equation 7, $\Delta f$ represents a spacing between subcarriers.

Like Equation 7, node A may estimate the starting time of a relative FFT window of node C by Equation 8 in STEP 3.

$$\text{Est\_offset\_fft\_Node}C(\text{in radian}) = \text{delta}\_\{C,A\} + (d\_\{A,C\}/c)*2*\pi*\Delta f \quad \text{[Equation 8]}$$

Node A may know the relative offset of the FFT window of node B/C by Equation 7/8. Node A may obtain d_{B, C} from the relative offset of FFT window of node B/C and the previously overheard Delta_{C, B} by Equation 9.

$$d\_\{B,C\} = (\text{Est\_offset\_fft\_node}C - \text{Est\_offset\_fft\_Node}B = \text{delta}\_\{C,B\})*c/(2*\pi*\Delta t) \quad \text{[Equation 9]}$$

While the present example has been described on the assumption that the order is node A, node B, and node C in the initial process, the present disclosure may also be applied to other orders. Further, if all nodes are to complete relative maps, each node should transmit a ranging RS once and needs feedback information from all other nodes. For example, to complete the relative maps of nodes A, B, and C, the above-described process may be performed in the order of node A, node B, node C, node A, and node B.

Although the initial process of configuring a relative map has been described above, each node may transmit its own information, that is, Delta information calculated from a ranging RS of another node after the initial process. Thus, each node may update the relative map based on the delta information.

For example, it is assumed that there are four nodes A, B, C, and D, and each node has transmitted a ranging RS once. Each node may acquire all Delta values using the ranging RSs transmitted from the other nodes. Each node may transmit already acquired Delta information at the time of transmitting the ranging RS to the other nodes. The other nodes may update their relative maps through distance measurement and overhearing.

For example, node B transmits a signal carrying a ranging RS and information of delta_{B, A}, delta_{B, C}, and delta_{B, D} at a predetermined time. Upon receipt of the signal, each node may update an existing relative map. Node A may re-calculate d_{A, B} from delta_{B, A} and the ranging RS. Further, node A may re-calculate d_{B, C} and d_{B, D} based on Delta_{B, C} and Delta_{B, D} obtained through overhearing. Similarly, node C may re-calculate d_{B, C} from Delta_{B, C} and the ranging RS. Node C may re-calculate d_{A, B} and d_{B, D} based on Delta_{B, A} and Delta_{B, D} obtained through overhearing.

To configure a relative map, a resource configuration and activation/deactivation (or windowing) information need to be defined/configured. The resource configuration may include a transmission order/pattern of each node and the physical resource position of a signal carrying a ranging RS and Delta information of the node.

For example, an eNB may allocate each node to the position of a time/frequency resource in which the node should transmit a ranging RS and Delta information, by a higher-layer signal (e.g., an RRC signal or a broadcast signal). Each node may determine its transmission time, reception time, and resource position from the information. The higher-layer signal may also include the number of repetitions of transmission/reception. For example, it is assumed that the eNB allocates the positions of time/frequency resources for transmission/reception to/from a total of 5 nodes. In this case, each node may be allocated one of a total of 5 resources as a transmission time resource. That is, each node performs reception in resources other than its own transmission time point among the total of 5 resources. Further, the eNB may configure which node will use which reception resource. For example, from a configuration that node 1 transmits resource 1, each node may identify the node that uses the transmission resource. Further, each node may determine whether to transmit its own delta information by corresponding configuration information. Further, the eNB may configure the number of repetitions and a repetition period for the resources configured for the 5 nodes.

After configuring only the total transmission resource configuration information, and the transmission time and repetition period of each node, the eNB may trigger transmission/reception through activation/deactivation. For example, the eNB may configure resource configurations 1 to 7 and transmission periods. The eNB may then indicate the start of transmission by triggering activation, and termination of transmissions of all nodes by triggering deactivation. The activation/deactivation indication may be delivered by a higher-layer signal.

Further, the eNB may reconfigure resources by a higher-layer signal (e.g., an RRC signal or a broadcast signal).

An environment in which one UE (e.g., vehicle) and a plurality of road side units (RSUs) may be considered. If the UE has prior knowledge of information about the absolute positions of three or more RSUs in advance, the UE may transmit a request signal to an eNB to determine its absolute position. In response to the request of the UE, the eNB may configure a ranging RS transmission time for the UE and a response of each RSU. The UE may calculate the distance between the UE and each RSU and the absolute position of the UE, from ranging RSs from three RSUs and Delta information.

Further, resources of the RSUs and the UE may preconfigured semi-statically.

The eNB may efficiently control interference through a relative map of the UE in an environment such as full duplex radio or UE-specific dynamic time division duplex (TDD).

Figure 9:
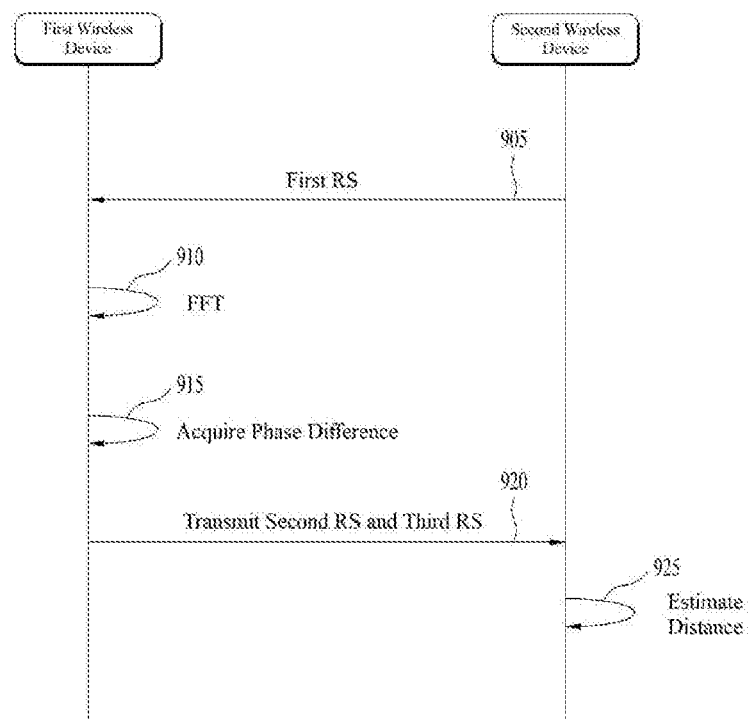
FIG. 9 is a diagram illustrating a signal flow for a method of transmitting and receiving an RS for distance measurement according to an embodiment of the present disclosure.

FIG. 9 is a flowchart illustrating a method of transmitting and receiving an RS for distance measurement according to an embodiment of the present disclosure. A description redundant with the foregoing description will be avoided herein. While only two wireless devices are illustrated for convenience, those skilled in the art will understand that more wireless devices may exist.

Referring to FIG. 9, a first wireless device receives, from a second wireless device, a first RS including a first sinusoidal signal having a first angular frequency and a second sinusoidal signal having a second angular frequency (905).

The first wireless device performs FFT on the first RS (910).

The first wireless device obtains a phase difference between the first sinusoidal signal and the second sinusoidal signal based on the result of the FFT (915). For example, the phase difference may be calculated by Equation 1. When Equation 1 is applied to this embodiment, '$t_{s,RX}$' may represent the starting time of the FFT for the first RS, '$t_{a,RX}$' may represent the arrival time of the first RS at the first wireless device, '$w_1$' may represent the first angular frequency, '$w_2$' may represent the second angular frequency, '$X_{RX}(w_1)$' may represent the FFT result of the first sinusoidal signal, and '$X_{RX}(w_2)$' may represent the FFT result of the second sinusoidal signal, in Equation 1.

The first wireless device transmits a second RS for distance measurement and a third RS indicating information about the phase difference to the second wireless device (920). The phase of the third RS may have as large an offset as the phase difference from the phase of the second RS.

The second wireless device estimates the distance between the first wireless device and the second wireless device using the information on the phase difference (925). For example, the distance between the first wireless device and the second wireless device may be calculated by Equation 6. When Equation 6 is applied to the present embodiment, in Equation 6, 'd' may represent the distance between the first wireless device and the second wireless device, 'c' may represent the speed of light, '$t_{symb}$' may represent one symbol length, 'θ' may represent the phase difference, Δf may represent the SCS between the second and third RSs, and '$delta_2$' may represent the difference between the arrival time of the second RS at the second wireless device and the time of performing FFT on the second RS.

Further, '$delta_2$' may be $t_{s,Tx}+(n+1)*t\_symb-t_{a,Tx}$. '$t_{s,Tx}$' may represent a time when the first RS is transmitted from the second wireless device, '$t_{a,Tx}$' may represent the arrival time of the second RS at the second wireless device, and 'n' may represent the number of symbols between the first RS and the second RS.

The process of exchanging the first RS, the second RS, and the third RS may be performed alternately in multiple wireless devices including the first, second, and third wireless devices.

The first wireless device may estimate the distance between the second wireless device and the third wireless device by overhearing information about a phase difference that the third wireless device transmits to the second wireless device.

Figure 10:
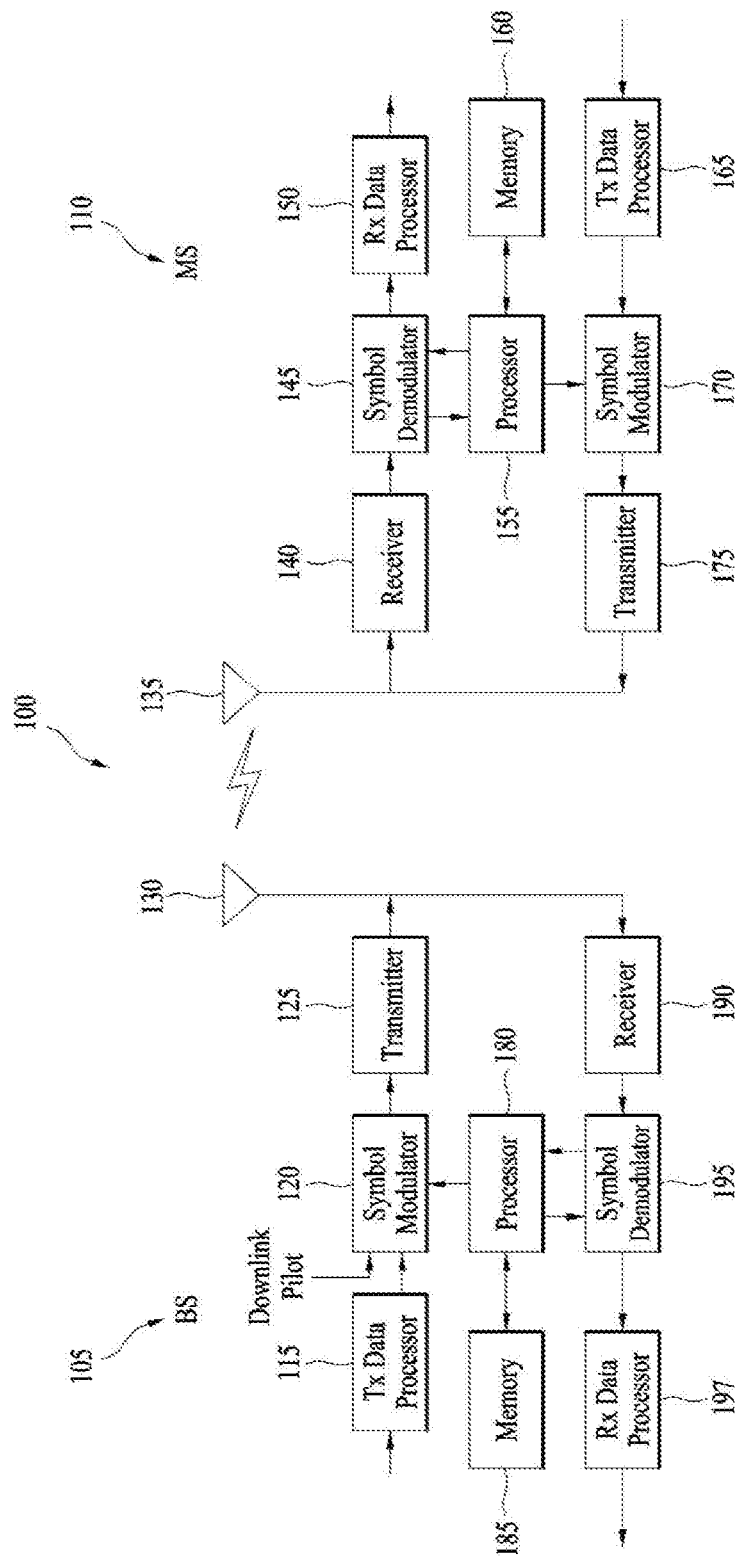
FIG. 10 is a block diagram illustrating a transmission apparatus and a reception apparatus according to an embodiment of the present disclosure.

FIG. 10 is a block diagram illustrating the configurations of a transmission device 105 and a reception device 110 in a wireless communication system 100 according to an embodiment of the present disclosure. For convenience, while it is assumed that the transmission device is a base station (BS) and the reception device is a terminal, the present disclosure is not limited thereto, and each of the transmission device and the reception device may be interpreted as any wireless node.

The BS may also be referred to as an eNB or gNB. The terminal may be referred to as a UE.

Although one transmission device 105 and one reception device 110 are shown to simplify the wireless communication system 100, the wireless communication system 100 may include one or more transmission devices and/or one or more reception devices.

The BS 105 may include a transmission (Tx) data processor 115, a symbol modulator 120, a transmitter 125, a transmission/reception antenna 130, a processor 180, a memory 185, a receiver 190, a symbol demodulator 195, and a reception (Rx) data processor 197. The UE 110 may include a Tx data processor 165, a symbol modulator 170, a transmitter 175, a transmission/reception antenna 135, a processor 155, a memory 160, a receiver 140, a symbol demodulator 155, and an Rx data processor 150. In FIG. 12, although one antenna 130 is used for the BS 105 and one antenna 135 is used for the UE 110, each of the BS 105 and the UE 110 may also include a plurality of antennas as necessary. Therefore, the BS 105 and the UE 110 according to the present disclosure support a multiple input multiple output (MIMO) system. The BS 105 according to the present disclosure can support both a single user-MIMO (SU-MIMO) scheme and a Multi User-MIMO (MU-MIMO) scheme.

In downlink, the Tx data processor 115 receives traffic data, formats the received traffic data, codes the formatted traffic data, interleaves the coded traffic data, and modulates the interleaved data (or performs symbol mapping upon the interleaved data), such that it provides modulation symbols (i.e., data symbols). The symbol modulator 120 receives and processes the data symbols and pilot symbols, such that it provides a stream of symbols.

The symbol modulator 120 multiplexes data and pilot symbols, and transmits the multiplexed data and pilot symbols to the transmitter 125. In this case, each transmission (Tx) symbol may be a data symbol, a pilot symbol, or a value of a zero signal (null signal). In each symbol period, pilot symbols may be successively transmitted during each symbol period. The pilot symbols may be an FDM symbol, an OFDM symbol, a time division multiplexing (TDM) symbol, or a code division multiplexing (CDM) symbol.

The transmitter 125 receives a stream of symbols, converts the received symbols into one or more analog signals, and additionally adjusts the one or more analog signals (e.g., amplification, filtering, and frequency upconversion of the analog signals), such that it generates a downlink signal appropriate for data transmission through an RF channel Subsequently, the downlink signal is transmitted to the UE through the antenna 130.

Configuration of the UE 110 will hereinafter be described in detail. The antenna 135 of the UE 110 receives a DL signal from the BS 105, and transmits the DL signal to the receiver 140. The receiver 140 performs adjustment (e.g., filtering, amplification, and frequency downconversion) of the received DL signal, and digitizes the adjusted signal to obtain samples. The symbol demodulator 145 demodulates the received pilot symbols, and provides the demodulated result to the processor 155 to perform channel estimation.

The symbol demodulator 145 receives a frequency response estimation value for downlink from the processor 155, demodulates the received data symbols, obtains data symbol estimation values (indicating estimation values of the transmitted data symbols), and provides the data symbol estimation values to the Rx data processor 150. The Rx data processor 150 performs demodulation (i.e., symbol-demapping) of data symbol estimation values, deinterleaves the demodulated result, decodes the deinterleaved result, and recovers the transmitted traffic data.

The processing of the symbol demodulator 145 and the Rx data processor 150 is complementary to that of the symbol modulator 120 and the Tx data processor 115 in the BS 205.

The Tx data processor 165 of the UE 110 processes traffic data in uplink, and provides data symbols. The symbol modulator 170 receives and multiplexes data symbols, and modulates the multiplexed data symbols, such that it can provide a stream of symbols to the transmitter 175. The transmitter 175 obtains and processes the stream of symbols to generate an uplink (UL) signal, and the UL signal is transmitted to the BS 105 through the antenna 135. The transmitter and the receiver of UE/BS can be implemented as a single radio frequency (RF) unit.

The BS 105 receives the UL signal from the UE 110 through the antenna 130. The receiver processes the received UL signal to obtain samples. Subsequently, the symbol demodulator 195 processes the symbols, and provides pilot symbols and data symbol estimation values received via uplink. The Rx data processor 197 processes the data symbol estimation value, and recovers traffic data received from the UE 110.

A processor 155 or 180 of the UE 110 or the BS 105 commands or indicates operations of the UE 110 or the BS 105. For example, the processor 155 or 180 of the UE 110 or the BS 105 controls, adjusts, and manages operations of the UE 210 or the BS 105. Each processor 155 or 180 may be connected to a memory unit 160 or 185 for storing program code and data. The memory 160 or 185 is connected to the processor 155 or 180, such that it can store the operating system, applications, and general files.

The processor 155 or 180 may also be referred to as a controller, a microcontroller), a microprocessor, a microcomputer, etc. In the meantime, the processor 155 or 180 may be implemented by various means, for example, hardware, firmware, software, or a combination thereof. In a hardware configuration, methods according to the embodiments of the present disclosure may be implemented by the processor 155 or 180, for example, one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, etc.

In a firmware or software configuration, methods according to the embodiments of the present disclosure may be implemented in the form of modules, procedures, functions, etc. which perform the above-described functions or operations. Firmware or software implemented in the present disclosure may be contained in the processor 155 or 180 or the memory unit 160 or 185, such that it can be driven by the processor 155 or 180.

Radio interface protocol layers among the UE 110, the BS 105, and a wireless communication system (i.e., network) can be classified into a first layer (L1 layer), a second layer (L2 layer) and a third layer (L3 layer) on the basis of the lower three layers of the Open System Interconnection (OSI) reference model widely known in communication systems. A physical layer belonging to the first layer (L1) provides an information transfer service through a physical channel. A radio resource control (RRC) layer belonging to the third layer (L3) controls radio resources between the UE and the network. The UE 110 and the BS 105 may exchange RRC messages with each other through the wireless communication network and the RRC layer.

The above-mentioned embodiments correspond to combinations of elements and features of the present disclosure in prescribed forms. And, it is able to consider that the respective elements or features are selective unless they are explicitly mentioned. Each of the elements or features can be implemented in a form failing to be combined with other elements or features. Moreover, it is able to implement an embodiment of the present disclosure by combining elements and/or features together in part. A sequence of operations explained for each embodiment of the present disclosure can be modified. Some configurations or features of one embodiment can be included in another embodiment or can be substituted for corresponding configurations or features of another embodiment. And, it is apparently understandable that an embodiment is configured by combining claims failing to have relation of explicit citation in the appended claims together or can be included as new claims by amendment after filing an application.

While the present disclosure has been described and illustrated herein with reference to the preferred embodiments thereof, it will be apparent to those skilled in the art that various modifications and variations can be made therein without departing from the spirit and scope of the invention. Thus, it is intended that the present disclosure covers the modifications and variations of this invention that come within the scope of the appended claims and their equivalents.

INDUSTRIAL APPLICABILITY

As described above, the present disclosure may be applied to various wireless communication systems.

What is claimed is:

1. A method of receiving a reference signal for distance measurement by a first wireless device in a wireless communication system, the method comprising:
receiving, from a second wireless device, a first reference signal including a first sinusoidal signal of a first angular frequency and a second sinusoidal signal of a second angular frequency;
performing fast Fourier transform (FFT) on the first reference signal;
obtaining a phase difference between the first sinusoidal signal and the second sinusoidal signal based on a result of the FFT; and
transmitting a second reference signal for distance measurement and a third reference signal indicating information about the phase difference to the second wireless device,
wherein the phase difference is calculated by Equation A, $$\frac{X_{RX}(w_2)}{X_{RX}(w_1)} = \exp(j*(w_2 - w_1)(t_{s,RX} - t_{a,RX}))$$ [Equation A]

where '$t_{s,RX}$' represents a starting time of the FFT for the first reference signal, '$t_{a,RX}$' represents an arrival time of the first reference signal at the first wireless device, '$w_1$' represents the first angular frequency, '$w_2$' represents the second angular frequency, '$X_{RX}(w_1)$' represents an FFT result of the first sinusoidal signal, and '$X_{RX}(w_2)$' represents an FFT result of the second sinusoidal signal.

2. The method according to claim 1, wherein a phase of the third reference signal has as large an offset as the phase difference from a phase of the second reference signal.

3. The method according to claim 1, wherein a distance between the first wireless device and the second wireless device is calculated by Equation B, $$d = \frac{c}{2}\left(t_{symb} - \frac{\theta}{2\pi * \Delta f} - delta_2\right)$$ [Equation B]

where 'd' represents the distance between the first wireless device and the second wireless device, 'c' represents the speed of light, '$t_{symb}$' represents one symbol length, 'θ' represents the phase difference, Δf represents a subcarrier spacing between the second reference signal and the third reference signal, and '$delta_2$' represents a difference between an arrival time of the second reference signal at the second wireless device and a time of performing FFT on the second reference signal.

4. The method according to claim 3, wherein '$delta_2$' is calculated by Equation C, $$delta_2 = t_{s,Tx} + (n+1)*t\_symb - t_{a,Tx}$$ [Equation C]

where '$t_{s,Tx}$' represents a time when the first reference signal is transmitted from the second wireless device, '$t_{a,Tx}$' represents the arrival time of the second reference signal at the second wireless device, and 'n' represents the number of symbols between the first reference signal and the second reference signal.

5. The method according to claim 1, wherein a process of exchanging the first reference signal, the second reference signal, and the third reference signal is performed alternately in a plurality of wireless devices including the first wireless device, the second wireless device, and the third wireless device.

6. The method according to claim 5, wherein the first wireless device estimates a distance between the second wireless device and the third wireless device by overhearing information about a phase difference transmitted to the second wireless device by the third wireless device.

7. A method of transmitting a reference signal for distance measurement to a first wireless device by a second wireless device in a wireless communication system, the method comprising:
transmitting, to the first wireless device, a first reference signal including a first sinusoidal signal of a first angular frequency and a second sinusoidal signal of a second angular frequency;
receiving, from the first wireless device, a second reference signal for distance measurement and a third reference signal indicating phase difference information; and
estimating a distance between the first wireless device and the second wireless device by using the phase difference information,
wherein the phase difference information indicates a phase difference between the first sinusoidal signal and the second sinusoidal signal, measured by the first wireless device receiving the first reference signal, and
wherein the distance between the first wireless device and the second wireless device is calculated by Equation B, $$d = \frac{c}{2}\left(t_{symb} - \frac{\theta}{2\pi * \Delta f} - delta_2\right)$$ [Equation B]

where 'd' represents the distance between the first wireless device and the second wireless device, 'c' represents the speed of light, '$t_{symb}$' represents one symbol length, 'θ' represents the phase difference, Δf represents a subcarrier spacing between the second reference signal and the third reference signal, and '$delta_2$' represents a difference between an arrival time of the second reference signal at the second wireless device and a time of performing fast Fourier transform (FFT) on the second reference signal.

8. The method according to claim 7, wherein a phase of the third reference signal has as large an offset as the phase difference from a phase of the second reference signal.

9. The method according to claim 7, wherein '$delta_2$' is calculated by Equation C, $$delta_2 = t_{s,Tx} + (n+1)*t\_symb - t_{a,Tx}$$ [Equation C]

where '$t_{s,Tx}$' represents a time when the first reference signal is transmitted from the second wireless device, '$t_{a,Tx}$' represents the arrival time of the second reference signal at the second wireless device, and 'n' represents the number of symbols between the first reference signal and the second reference signal.

10. The method according to claim 7, wherein the phase difference is calculated by Equation A, $$\frac{X_{RX}(w_2)}{X_{RX}(w_1)} = \exp(j*(w_2 - w_1)(t_{s,RX} - t_{a,RX}))$$ [Equation A]

where '$t_{s,RX}$' represents a starting time of the FFT for the first reference signal, '$t_{a,RX}$' represents an arrival time of the first reference signal at the first wireless device, '$w_1$' represents the first angular frequency, '$w_2$' represents the second angular frequency, '$X_{RX}(w_1)$' represents an FFT result of the first sinusoidal signal, and '$X_{RX}(w_2)$' represents an FFT result of the second sinusoidal signal.

11. The method according to claim 7, wherein a process of exchanging the first reference signal, the second reference signal, and the third reference signal is performed alternately in a plurality of wireless devices including the first wireless device, the second wireless device, and the third wireless device.

12. A first wireless device for receiving a reference signal for distance measurement in a wireless communication system, the first wireless device comprising:
a transceiver; and
a processor configured to, by controlling the transceiver, receive, from a second wireless device, a first reference signal including a first sinusoidal signal of a first angular frequency and a second sinusoidal signal of a second angular frequency, perform fast Fourier transform (FFT) on the first reference signal, obtain a phase difference between the first sinusoidal signal and the second sinusoidal signal based on a result of the FFT, and transmit a second reference signal for distance measurement and a third reference signal indicating information about the phase difference to the second wireless device,
wherein the phase difference is calculated by Equation A, $$\frac{X_{RX}(w_2)}{X_{RX}(w_1)} = \exp(j*(w_2 - w_1)(t_{s,RX} - t_{a,RX}))$$ [Equation A]

where '$t_{s,RX}$' represents a starting time of the FFT for the first reference signal, '$t_{a,RX}$' represents an arrival time of the first reference signal at the first wireless device, '$w_1$' represents the first angular frequency, '$w_2$' represents the second angular frequency, '$X_{RX}(w_1)$' represents an FFT result of the first sinusoidal signal, and '$X_{RX}(w_2)$' represents an FFT result of the second sinusoidal signal.

13. The first wireless device according to claim 12, wherein the first wireless device is capable of communicating with at least one of another wireless device, a wireless device related to an autonomous driving vehicle, a base station or a network.

14. A second wireless device for transmitting a reference signal for distance measurement to a first wireless device in a wireless communication system, the second wireless device comprising:
a transceiver; and
a processor configured to, by controlling the transceiver, transmit, to the first wireless device, a first reference signal including a first sinusoidal signal of a first angular frequency and a second sinusoidal signal of a second angular frequency, receive, from the first wireless device, a second reference signal for distance measurement and a third reference signal indicating phase difference information, and estimate a distance between the first wireless device and the second wireless device by using the phase difference information,
wherein the phase difference information indicates a phase difference between the first sinusoidal signal and the second sinusoidal signal, measured by the first wireless device receiving the first reference signal, and
wherein the distance between the first wireless device and the second wireless device is calculated by Equation B, $$d = \frac{c}{2}\left(t_{symb} - \frac{\theta}{2\pi * \Delta f} - delta_2\right)$$ [Equation B]

where 'd' represents the distance between the first wireless device and the second wireless device, 'c' represents the speed of light, '$t_{symb}$' represents one symbol length, '$\theta$' represents the phase difference, $\Delta f$ represents a subcarrier spacing between the second reference signal and the third reference signal, and '$delta_2$' represents a difference between an arrival time of the second reference signal at the second wireless device and a time of performing fast Fourier transform (FFT) on the second reference signal.

\* \* \* \* \*